*(12)* United States Patent
Hedler et al.

(10) Patent No.: US 6,919,232 B2
(45) Date of Patent: Jul. 19, 2005

(54) PROCESS FOR PRODUCING A SEMICONDUCTOR CHIP

(75) Inventors: Harry Hedler, Germering (DE); Roland Irsigler, Munich (DE); Barbara Vasquez, Orinda, CA (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/284,649

(22) Filed: Oct. 31, 2002

(65) Prior Publication Data

US 2003/0094695 A1 May 22, 2003

(30) Foreign Application Priority Data

Nov. 16, 2001 (DE) .......................................... 101 56 386

(51) Int. Cl.[7] .......................... H01L 21/44; H01L 21/48; H01L 21/50
(52) U.S. Cl. .......................... 438/127; 438/124; 438/126
(58) Field of Search .................................. 438/108, 127, 438/118, 124, 125, 126; 257/778, 783, 787–788, 790, 792–793, 620, 737, 738, 789, 723

(56) References Cited

U.S. PATENT DOCUMENTS

| 4,927,740 | A | * | 5/1990 | Wallbillich et al. | |
| 5,212,387 | A | * | 5/1993 | Swan | 250/515.1 |
| 5,998,243 | A | * | 12/1999 | Odashima et al. | 438/127 |
| 6,043,564 | A | * | 3/2000 | Brooks et al. | |
| 6,177,725 | B1 | | 1/2001 | Yamada et al. | |
| 6,429,043 | B1 | * | 8/2002 | Nakazawa et al. | |
| 6,448,633 | B1 | * | 9/2002 | Yee et al. | 257/666 |
| 6,507,092 | B1 | * | 1/2003 | Fukasawa et al. | 257/620 |

FOREIGN PATENT DOCUMENTS

| DE | 36 30 995 A1 | 3/1988 |
| DE | 40 40 822 A1 | 7/1992 |
| DE | 44 01 588 A1 | 7/1995 |
| DE | 195 26 511 A1 | 1/1996 |
| DE | 44 35 120 A1 | 4/1996 |
| DE | 197 28 992 A1 | 1/1999 |
| DE | 101 06 492 A1 | 8/2001 |
| JP | 01179334 A | 7/1989 |
| JP | 10-079362 | 3/1998 |

OTHER PUBLICATIONS

Korean Office Action dated Oct. 28, 2004.

* cited by examiner

*Primary Examiner*—Hoai Pham
*Assistant Examiner*—Dilinh Nguyen
(74) *Attorney, Agent, or Firm*—Jenkins, Wilson & Taylor, P.A.

(57) ABSTRACT

A process for producing a semiconductor chip having contact elements protruding on one chip side within the context of wafer level packaging, the chip side provided with the contact elements being coated with a covering compound forming a protective layer, from which the protruding contact element project.

19 Claims, 3 Drawing Sheets

PROCESS FOR PRODUCING A SEMICONDUCTOR CHIP

TECHNICAL FIELD

The invention relates to a process for producing a semiconductor chip having contact elements protruding on one chip side.

BACKGROUND ART

Wafer level packaging is a particularly cost-effective method of producing chip-size packages, that is to say components of the size of a chip. These components are soldered or adhesively bonded onto the circuit board or the module board with the active side at the bottom by means of flip-chip technology, and are not further housed (chip on board). The contact elements used, which are called "bumps", are in this case either rigid bumps (solder or gold bumps) or flexible, resilient polymer bumps (soft bumps), which are connected by cross-wiring to the connecting pads of the chip.

Within the context of wafer level packaging it is known to coat the rear of the wafer, on which the individual chips are formed, before the chips are separated by sawing up the wafer, in order in this way to protect the rear which, after the separated chips have been fitted to the circuit board or the module board, is exposed. This is advantageous in particular within the context of handling the chips when populating a circuit board or a module board, and even during the handling of the populated circuit board or the module board itself. However, from time to time damage occurs to the naked chip in the area of its chip side provided with the contact elements, said damage being disadvantageous and possibly leading to failure of a chip.

SUMMARY OF THE INVENTION

The invention is based on the problem of specifying a possible way of eliminating the aforementioned disadvantages.

In order to solve this problem, in a process of the type mentioned at the beginning, the invention provides for the chip side provided with the contact elements to be coated with a covering compound forming a protective layer, from which the protruding contact elements project.

The process according to the invention proposes to coat the chips side provided with the contact elements, that is to apply to it a protective layer which protects the coated semiconductor material against damage. At the same time, care must be taken that the thickness of the protective layer is chosen such that contact elements already formed still project sufficiently far from the layer surface in order that it is subsequently possible to make reliable contact between the chip and the circuit board or the module board.

As an alternative to this, however, it is also possible to embed the contact elements completely in the protective layer and then to expose the contact points of the contact elements by means of suitable methods (etching, lasering, . . . )

It is particularly expedient to produce this coating within the context of the wafer level packaging, that is to say a plurality of chips are coated simultaneously with the compound. In this connection, wafer level packaging can be carried out in two different ways. Firstly, use can be made of a wafer having chips formed on it which are not yet separated and whose contact elements have already been produced, so that there is "true" wafer level packaging. Alternatively, there is also the possibility for a plurality of separated chips, which are arranged appropriately, as described further below, and therefore form a "quasi-wafer" because of their arrangement, to be coated jointly.

In this case, it is expedient if the separated chips or the wafer are/is initially arranged on an adhesive carrier, in particular a film, after which the coating is carried out. The individual chips are therefore fixed in their position by the carrier, there being the possibility here, firstly of arranging the chips directly beside on another or positioning them spaced apart at any desired pitch from one another. When individual chips are used, it is particularly expedient if only chips tested and found to be serviceable in a preceding function test are used, so that in this way a "known good die wafer" is assembled and comprises only serviceable chips, so that it can subsequently be assumed that the semiconductor chips produced in accordance with the process of the invention also actually function. Non-functioning chips are accordingly already separated out previously.

Furthermore, it is particularly expedient, if in the case of separated chips, in addition to the chip side bearing the contact elements, the adjoining side edges are also coated with the compound. In this case, therefore, the chip is also formed laterally in the compound and the side edges are also covered with a protective layer. In this case, in particular the risk of a break-out in the edge region of the chip side toward the adjacent side edges is ruled out.

In order to improve the protection of a semiconductor chip still further, provision can be made according to the invention that, in the case of separated chips, the rear side of the chip is additionally also coated with the compound, at least in some sections, primarily in the edge region. If, therefore, both the chip side bearing the contact elements, the side edges and also at least some sections of a chip rear side are coated, then the chip is embedded to the greatest possible extent, and comprehensive edge protection is provided.

According to a first inventive alternative, provision is made for the separated chips or the chips bound in the wafer to be arranged in a mold whose upper mold presses the chips against the lower mold, slightly compressing the resilient contact elements, after which the compound for the subsequent protective layer is introduced into the mold and cured. This configuration of the invention is based on resilient contact elements, that is to say for example resilient polymer bumps, which are formed on the separated chips adhesively bonded to the carrier film, for example, or on the wafer not yet sawn up. The separated chips—either in an actually separated arrangement or in the form of the "known good wafer" with the carrier film—or the wafer is inserted into a mold whose one mold half presses the chips or the wafer against the other mold half. This leads to the resilient contact element being compressed somewhat, the deformation being only a few $\mu$m, for example about 50 $\mu$m. This means that the distance between the chip side and the opposite mold half is reduced somewhat by the compression of the resilient contact elements. The compound is then introduced into the mold, primarily injected, so that it is distributed in the region between the chip side and the mold half. Following the curing of the compound, the mold is opened and the compressed resilient contact elements are relieved. They expand and assume their originally larger forms, in which they then project from the cured protective layer.

As an alternative to this, the compound of the protective layer can already be introduced into the mold (for example in the form of powder, paste, tablets, . . . ) before the wafer is inserted into the mold. In this case, the compound is melted before the wafer with the resilient contact elements is compressed.

While the inventive alternative described is used only for those chips which have resilient contact elements, the inventive alternative described below can be used both in the case of chips with resilient contact elements and those with rigid contact elements. According to this inventive embodiment, provision is made for the separated chips or the chips bound in the wafer to be arranged in a mold whose one mold half has depressions into which the protruding contact elements engage with their front regions in such a way that the chip side is spaced somewhat apart from the mold half, after which, following closure of the mold, the compound is introduced and cured. The depressions are arranged so as to correspond with the positions of the contact elements on the chips, so that it is ensured that a contact element also actually engages in a depression. By means of this engagement, the chip is lowered somewhat with respect to the surface of the mold half, so that following the injection and curing of the compound, the contact elements project from the cured protective layer with their front region accommodated in the depressions in the process.

For the simultaneous coating also of the side edges of the separated chips introduced into the mold, it is expedient if the separated chips are arranged spaced apart from one another on the carrier, in particular the film. As already described at the beginning, there is a possibility of arranging the chips at any desired pitch on the carrier in order to form a "quasi-wafer". If this arrangement with the spaced-apart chips is then introduced into the mold, the injected compound can be distributed not only in the region between the chip side and mold surface but also in the region between the individual chips. In this way, the chips are embedded in the compound in the region of their side edges as well, so that a protective layer can be formed.

Finally, in order also to permit the rear side of the chip being at least partially coated with the compound, it can be expedient if a structured upper mold is used, which acts on the chip rear side only at points, primarily at its center, so that the remaining free chip rear side is also coated with the compound. The mold half associated with the chip rear side is therefore structured in such a way that the injected compound can cover the chip rear side at least at the edge, so that a protective layer can also be produced there.

In every case, the chips which have been separated but are arranged spaced apart from one another are, so to speak, embedded by means of the compound in a holding frame formed by the compound. If, then, the chip arrangement injection-molded in this way or else the wafer only coated on the chip side provided with contact elements is removed from the mold, then the chips, if necessary following removal of the carrier, are separated. This is done either by dividing up the cured compound forming the holding frame or by separating the wafer by means of suitable processes, such as sawing or laser cutting or water-jet cutting or mixed forms thereof.

In addition to the above described process using a mold and an injected or pre-metered compound the compound can alternatively also be applied to the chip side, if appropriate the side edges and at least partially the chip rear side, in the printing process. Alternatively, the application of the compound in a dispensing process is also possible.

Furthermore, it is expedient if, before or after being coated with the compound, the chip rear side, if appropriate to the extent to which it is still exposed, is coated with a further compound. This additional rear protective layer can be provided before the coating according to the process as chosen above. If it is carried out thereafter, then, depending on which of the process alternatives according to the invention is used, the chip rear side may either be completely blank or at least partially coated, primarily at the edge, with the first compound. Here, there is then the possibility either of covering the rear side completely with the second compound or else of likewise covering the still free rear-side regions. In this case, the coating of the chip rear side can be carried out in a printing process, a dispensing process, a sputtering process or else an injection-molding process.

In addition to the process, the invention further relates to a semiconductor chip, in particular produced in accordance with the process described, having rigid or resilient contact elements protruding on one chip side. This semiconductor chip is distinguished by the fact that the chip side provided with the contact elements is coated with a covering compound forming a protective layer, from which the protruding contact elements project. In addition to the chip side itself, the side edges adjoining the chip side having the contact elements can also be coated with the compound. In addition, the chip rear side can also be covered with the compound, at least in some sections, primarily in the edge region, forming a protective layer. For complete encapsulation, the chip rear side, if appropriate to the extent to which it is still exposed, can also be coated with a further compound. The compound itself and, if appropriate the further compound is a nonconductive compound based on a polymer.

The compound used to coat the chip side bearing the contact elements should be one which preferably adheres poorly to the contact elements (resilient bumps, for example of silicone) and which moreover likewise adheres poorly to any metallic coating of a contact element (primarily gold), so that the flexibility of the cross-wiring conductor tracks which lead from the individual contact elements to the contact pads of the chip is not significantly impaired.

BRIEF DESCRIPTION OF THE DRAWINGS

Further advantages, features and details of the invention emerge from the exemplary embodiments described in the following texts, and by using the drawings, in which.

DETAILED DESCRIPTION OF THE INVENTION

Figure 1:
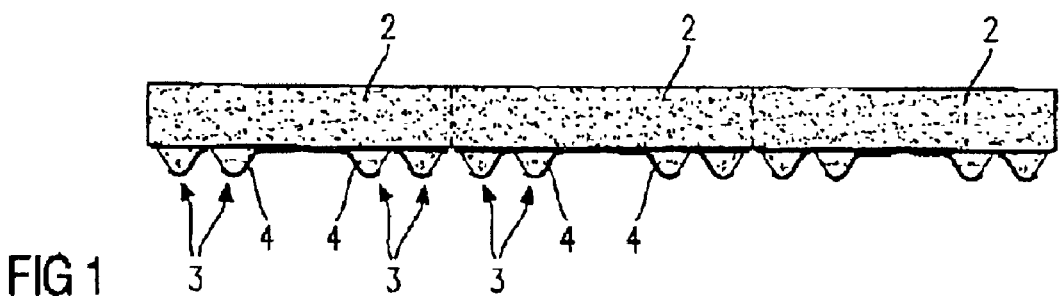
FIGS. 1–7 show the production of a semiconductor chip according to a first process variant according to the invention by compressing resilient contact elements.

FIG. 1 shows a front end wafer 1, on which, in the example shown, three chips 2 are formed as an example. These have not yet been separated. On the front end wafer 1, on the active chip side, soft, resilient contact elements 3 are produced, for example in a printing process, and have a cross-wiring layer 4 via which they are connected to contact pads on the chip. The soft resilient contact elements generally consist of silicone and can be conductive or nonconductive.

After the production of the contact elements, the wafer can be subjected to a wafer level test, in order to test the individual chips with regard to their serviceability. In this case, faulty chips can be detected.

Figure 2:
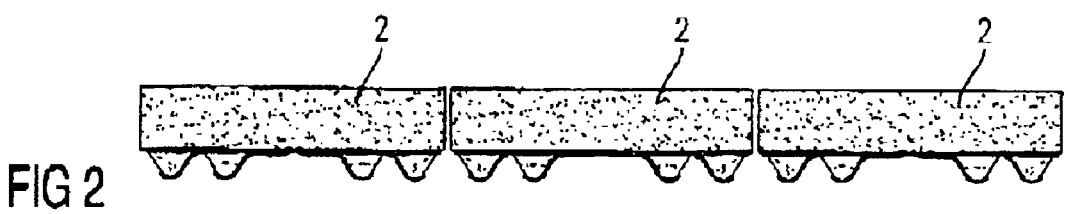

In FIG. 2, the chips are separated from the front end wafer, for example by means of sawing.

Figure 3:
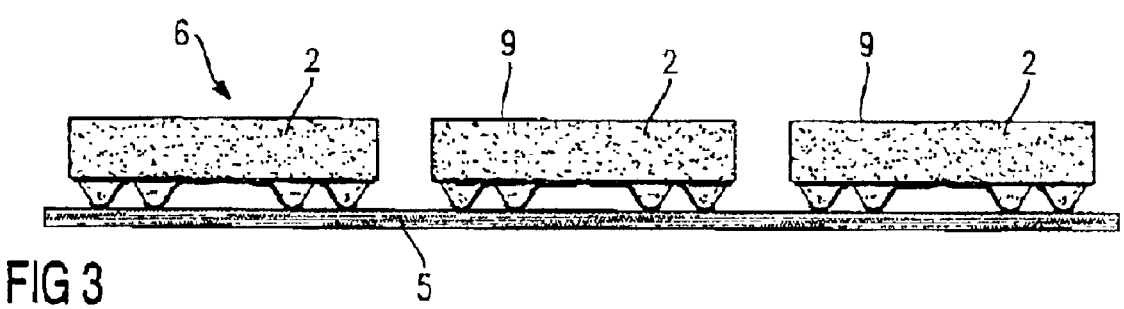

From the separated chips, then, see FIG. 3, the chips 2 tested as serviceable are adhesively bonded to a carrier 5, here a carrier film with a self-adhesive surface, with their contact elements pointing toward the carrier 5. As can be seen, the chips are arranged at a distance from one another, the distance being considerably greater than the pitch at which they have been produced on the actual wafer. The chip arrangement fixed via the carrier 5 can be referred to as a quasi-wafer, since the entire chip arrangement is to be handled like a wafer.

As an alternative to this, the wafers still spread out on the sawing film can also be used. In this case, the separated chips on the film can be spaced further apart by pulling the film apart ("racking").

Figure 4:
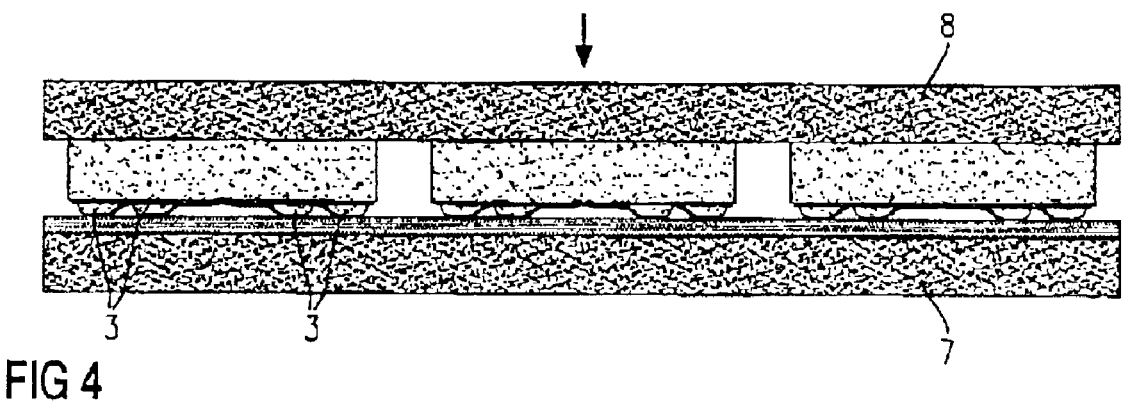

In the step according to FIG. 4, this chip arrangement 6 is then arranged in a mold comprising a lower mold half 7 and an upper mold half 8, only a detail being shown here, too. The upper mold half 8 which bears on the rear side 9 of the chip, then presses the chips 2 somewhat against the lower mold half 7, so that the contact element 3 are compressed slightly. The level of deformation is a few $\mu$m, for example 50 $\mu$m. As an option, a film can also be clamped between the upper mold half and the rear side of the chip, in order to produce a leak proof connection between the two mold halves and prevent the compound 10 running out.

Figure 5:
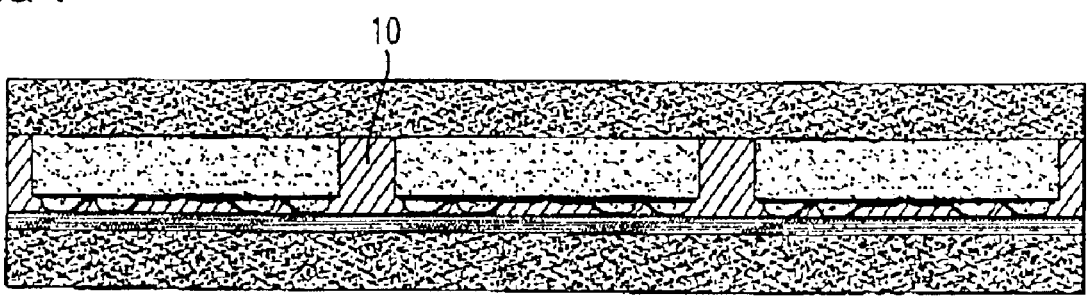
Figure 6:
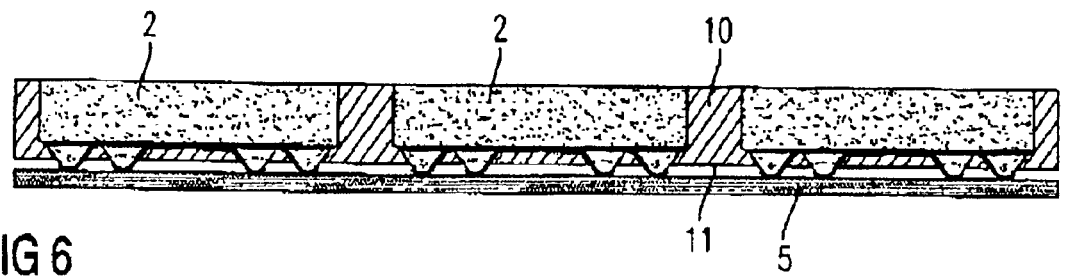
Figure 7:
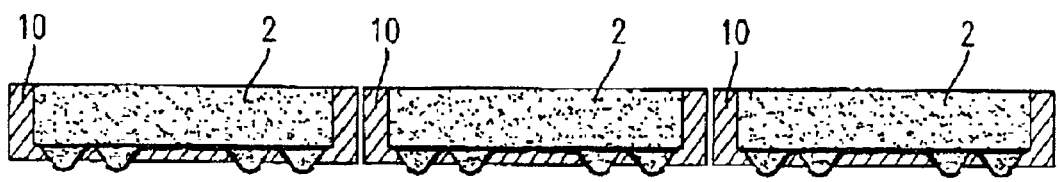

Then, as FIG. 5 shows, a compound 10 is injected into the mold, and is distributed in between the active chip side, which bears the contact elements 3, [lacuna] and in the region between the chips 2. The chip arrangement 6 remains in the mold until the compound 10 has been completely or at least partly cured. The mold is then opened, and the chip arrangement 6 embedded in the cured compound 10 is removed from the mold. The cured compound 10 forms a type of holding frame in which the chips 2 are embedded. As FIG. 6 shows, the contact elements 3 expand after being relieved of load and removed from the mold and return into their original form, in which they project from the compound 10 or from the surface 11 of the compound to the extent of their earlier deformation. It can be seen, see FIG. 6, that the carrier 5 is spaced somewhat apart from the surface 11 of the compound, which can be attributed to the extension of the contact elements 3.

If the carrier 5 is then pulled off, which is readily possible, since the holding frame formed by the cured compound 10 is sufficiently stable, the individual chips 2 can be separated by sawing up or cutting up the cured compound 10. As can be seen, a chip is embedded completely in the compound both on its active chip side having the contact elements and at the side edges, the contact elements nevertheless still continuing to project forward sufficient for contact to be made reliably between the chip and a circuit board or a module board.

At this point, it should be pointed out that there is the possibility, after the chip arrangement has been removed from the mold, of coating the chip rear side 9 with a further compound in an additional process step, in order also to carry said side with a protective covering. This is expediently carried out before the separation of the chips.

Figure 8:
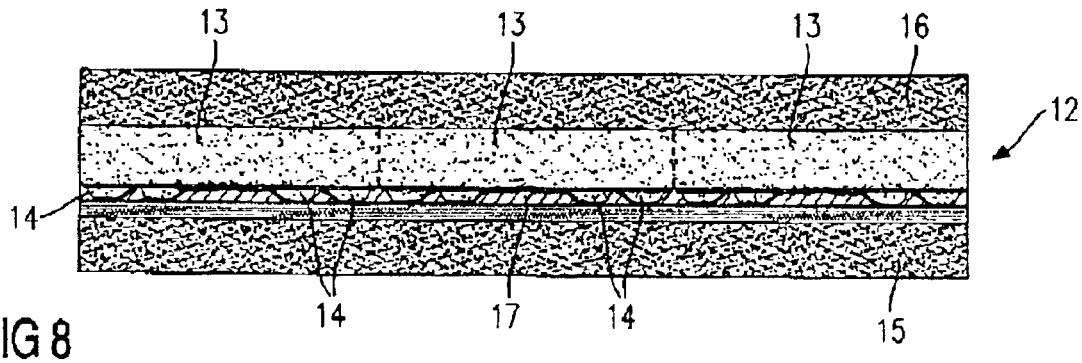
FIGS. 8–10 show the production of a semiconductor chip according to a second process variant according to the invention, likewise by compressing resilient contact elements.
Figure 9:
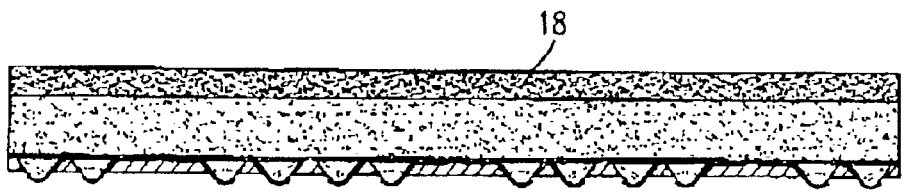
Figure 10:
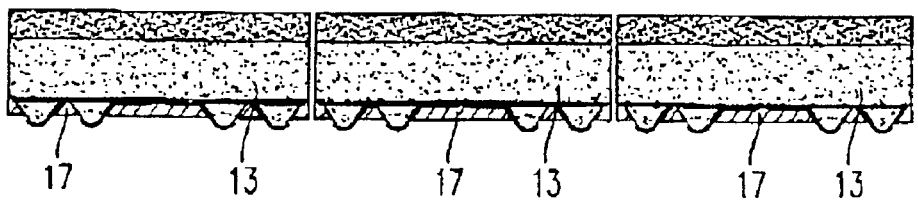

FIGS. 8 and 10 show a process variant similar to the described process variant, but here the finally processed front end wafer 12 itself is used. The wafer 12, on which, in the example shown, a plurality of chips 13 have likewise been formed and provided with contact elements 14, is put into the mold comprising two mold halves 15, 16, the contact elements 14 being compressed somewhat here, too, as a result of the mold halves being moved together. The compound 17 is then injected. Following the removal of the wafer 12 coated on the active side in this way with a protective layer consisting of the cured compound 17, a further compound 18 is applied to the chip rear side, for example in a printing process, in order to form a protective layer, after which the individual chips 13 are separated. The process illustrated here by way of example to this extent corresponds to the process according to FIGS. 1–7, in that here, too, the contact elements are compressed somewhat in order to ensure that they project from the protective layer subsequently produced. As distinct from the separated chips in the first-named embodiment, here the complete wafer is used. While in the process according to FIGS. 1–7 both the active chip side and the side edges can be covered by a coating, in the process according to FIGS. 8–10 only the active side can be coated.

Figure 11:
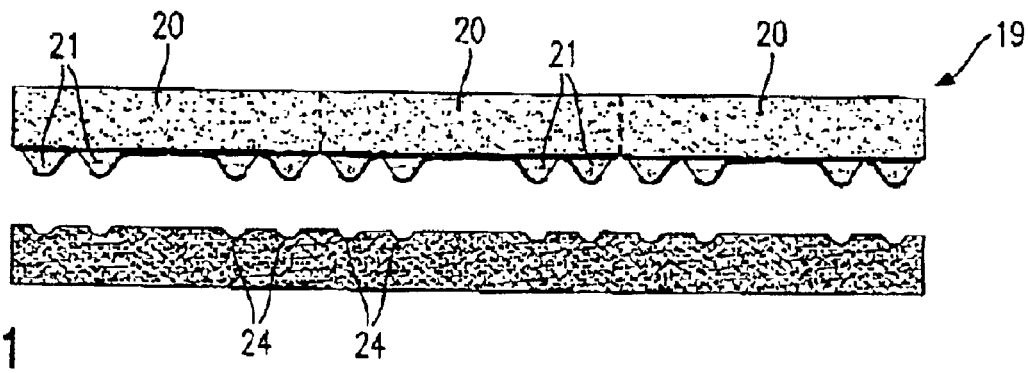
FIGS. 11 and 12 show the production of a semiconductor chip according to a third process variant according to the invention.
Figure 12:
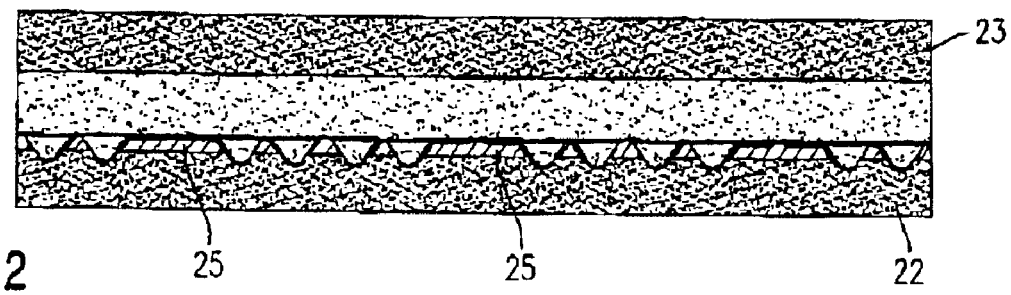

FIG. 11 shows a third process variant according to the invention. Here, too, a wafer 19 processed in the front end and having a large number of chips 20 formed on it is used, the chips 20 already having been provided with contact elements 21. The wafer 19 is then inserted into a mold having an upper and a lower mold half 22, 23, the lower mold half, in the example shown, having depressions 24 in which, see FIG. 12, the contact elements 21 engage with their front tip region. After the mold has been closed, a compound 25 is injected and fills the space between the front chip side and the mold surface. After the compound has cured, the wafer 19 is removed from the mold, the contact elements 21 project from the compound 25 with their sections accommodated in the depressions 24 during the injection-molding. Here, too, the separation of the chips is subsequently carried out, if appropriate following the preceding application of a rear-side coating.

Here, it should be pointed out that, in this process variant, the contact elements 21 can be resilient or rigid, since they do not have to be deformed.

Figure 13:
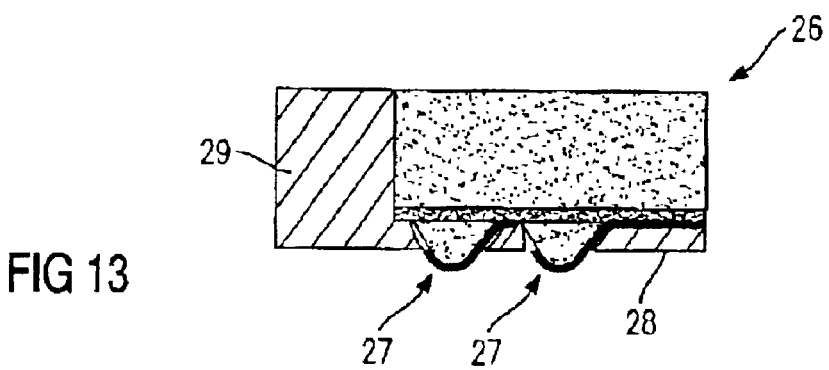
FIG. 13 shows an enlarged partial view of a semiconductor chip according to the invention in the area of the contact elements.

FIG. 13 shows a chip 26 in the form of an enlarged detailed view. It can be seen how the contact elements 27 project from the surface 28 of the compound 29. The compound used should in this case ensure that it does not adhere to the contact elements 27, be it the actual rigid or resilient contact material or the cross-wiring, so that it does not hamper the expansion of the resilient contact elements 27. As FIG. 13 shows, in the ideal case, the compound 29 even separates somewhat from the contact elements 27.

Figure 14:
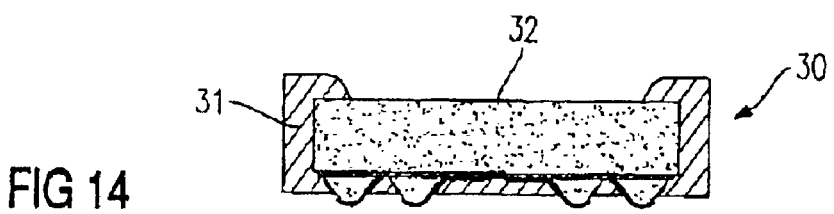
FIG. 14 shows a further embodiment of a semiconductor chip according to the invention.

FIG. 14 shows a further embodiment of a semiconductor chip 30 according to the invention. The latter is coated with the compound 31, as can be seen, both on the chip front side, in the region of the side edges and on the chip rear side, at the edges there. The chip rear side 32 is exposed in the uncoated region. This can be achieved, for example, by a mold being used which rests on the chip side 32 only in the central region, so that the compound 31 can cover the chip rear side 32 in the chip region on the edge side.

Finally, it should be pointed out that the compound used expediently a compound which is still somewhat soft following curing, for example a polymer compound based on silicone or polyurethane acrylate.

Furthermore, other processes (for example stenciling or screen printing or dispensing processes), are also conceivable.

What is claimed is:

1. A process for producing a plurality of semiconductor chips having resilient contact elements protruding on one semiconductor chip side within the context of wafer level packaging; characterized in that wherein the semiconductor chip side provided with the resilient contact elements is coated with a covering compound forming a protective layer from which the protruding resilient contact elements project (a) wherein said plurality of semiconductor chips are arranged in a mold as separated semiconductor chips or bound in a wafer, one half of such mold being directed to rear sides of said semiconductor chips and the other half of said mold directed to said resilient contact elements, wherein one mold half presses the chips against the other mold half to slightly compress the resilient contact elements;

(b) wherein said covering compound is filled into said mold and cured in said mold;

(c) said mold is removed after said covering compound is cured; and (d) said plurality of semiconductor chips with said resilient contact elements protruding on said one semiconductor chip side are separated by cutting said cured covering compound or by cutting said wafer.

2. The process as claimed in claim 1, wherein the plurality of semiconductor chips are coated simultaneously with the covering compound.

3. The process as claimed in claim 2, wherein use is made of a plurality of separated chips or the wafer having the plurality of semiconductor chips formed on it.

4. The process as claimed in claim 3, wherein the separated chips or the wafer are/is initially arranged on an adhesive carrier, in particular a film, after which the coating is carried out.

5. The process as claimed in claim 3, wherein in the case of separated chips, in addition to the chip side bearing the contact elements, adjoining side edges are also coated with the compound.

6. The process as claimed in claim 3, wherein in the case of separated chips, the chip rear side is additionally also coated with the compound, at least in some sections, primarily in an edge region.

7. The process as claimed in claim 1, wherein the separated chips or the chips bound in the wafer are arranged in the mold whose one mold half has depressions into which the protruding contact elements engage with their front region in such a way that the chip side is spaced somewhat apart from the mold half, after which, following closure of the mold, the compound is introduced and cured.

8. The process as claimed in claim 1, wherein for the purpose of simultaneous coating of the side edges as well, the separated chips are arranged spaced apart from one another on the carrier, in particular the film.

9. The process as claimed in claim 1, wherein a structured upper mold is used, which acts on the chip rear side only at points, primarily at its center, so that the remaining free chip rear side can be coated with compound.

10. The process as claimed in claim 1, wherein the chips, following the curing and the removal from the mold, if necessary following the removal of the carrier, in particular the film, are separated by dividing the cured compound or the wafer.

11. The process as claimed in claim 1, wherein the compound is applied to the chip front side, if appropriate the side edges or, at least partially, the chip rear side in a printing process.

12. The process as claimed in claim 1, wherein the compound is applied to the chip front side, if appropriate the side edges or, at last partially, the chip rear side in a dispensing process.

13. The process as claimed in claim 1, wherein before or after being coated with the compound, the chip rear side, if appropriate to the extent to which it is still exposed, is coated with a further compound.

14. The process as claimed in claim 13, wherein the coating of the chip rear side is applied in a printing process, a dispensing process, a sputtering process or an injection-molding process.

15. A semiconductor chip, in particular produced in accordance with the process as claimed in claim 1, having resilient contact elements protruding on one chip side, wherein the chip side provided with the contact elements is coated with the covering compound forming the protective layer, from which the protruding contact elements project.

16. A semiconductor chip as claimed in claim 15, wherein side edges adjoining the chip side having the contact elements is also coated with the compound.

17. The semiconductor chip as claimed in claim 15, wherein the chip rear side is also coated with the compound, at least in some sections, primarily in an edge region.

18. The semiconductor chip as claimed in claim 15, wherein the chip rear side, if appropriate to the extent that it is still exposed, is coated with a further compound.

19. The semiconductor chip as claimed in claim 15, wherein the compound and, if appropriate, the further compound is a nonconductive compound based on a polymer, in particular a silicone compound or a polyurethane acrylate.

* * * * *